(12) United States Patent
Trzcinski et al.

(10) Patent No.: US 11,299,803 B2
(45) Date of Patent: Apr. 12, 2022

(54) METALLIC COATING PROCESS FOR COMBUSTOR PANELS USING A BARREL CONFIGURATION

(71) Applicant: United Technologies Corporation, Farmington, CT (US)

(72) Inventors: Frank J. Trzcinski, Milford, PA (US); Scott A. Elliott, Rock Hill, NY (US); Andrew Cervoni, Staatsburg, NY (US)

(73) Assignee: Raytheon Technologies Corporation, Farmington, CT (US)

( * ) Notice: Subject to any disclaimer, the term of this patent is extended or adjusted under 35 U.S.C. 154(b) by 107 days.

(21) Appl. No.: 16/240,047

(22) Filed: Jan. 4, 2019

(65) Prior Publication Data

US 2019/0203347 A1 Jul. 4, 2019

Related U.S. Application Data

(60) Provisional application No. 62/613,723, filed on Jan. 4, 2018.

(51) Int. Cl.
*C23C 14/50* (2006.01)
*B05B 13/02* (2006.01)
(Continued)

(52) U.S. Cl.
CPC ........ *C23C 14/505* (2013.01); *B05B 13/0285* (2013.01); *C23C 4/02* (2013.01);
(Continued)

(58) Field of Classification Search
CPC .............. C23C 14/505; B05B 13/0285; H01L 21/68764
See application file for complete search history.

(56) References Cited

U.S. PATENT DOCUMENTS 4,192,253 A * 3/1980 Aichert ................. C23C 14/225
118/712
5,997,947 A * 12/1999 Burns ................... C23C 14/505
118/500

(Continued)

FOREIGN PATENT DOCUMENTS

| CN | 106835031 | * | 6/2017 | ......... C23C 14/0026 |
| EP | 2500446 A1 | | 9/2012 | |
| WO | WO2009063789 A1 | | 5/2009 | |

OTHER PUBLICATIONS

Extended European Search Report for EP Application No. 19150408.3, dated May 22, 2019, p. 6.

*Primary Examiner* — Keath T Chen
(74) *Attorney, Agent, or Firm* — Kinney & Lange P.A.

(57) ABSTRACT

A method of coating a component includes attaching the component to a support that is configured to hold a plurality of components and placing a base of the support in a holder that is attached to rotatable member of a fixture, wherein an axis of the holder is parallel to an axis of rotation of the rotatable member. The method also includes transporting the fixture into a coating chamber wherein a direction of an exit stream of a coater in oriented perpendicularly to the axis of rotation, exposing the fixture and the component to a reverse transfer arc cleaning/pre-heating procedure, and exposing the fixture and the component to a coating procedure during which a coating is directed at the component in a direction perpendicular to the axis of rotation while the rotatable member is rotating. The method further includes transporting the fixture and removing the component from the support fixture.

5 Claims, 4 Drawing Sheets

(51) Int. Cl.
*C23C 4/134* (2016.01)
*F23M 5/00* (2006.01)
*C23C 4/073* (2016.01)
*C23C 14/02* (2006.01)
*C23C 4/137* (2016.01)
*C23C 4/02* (2006.01)
*C23C 14/16* (2006.01)
*C23C 24/04* (2006.01)

(52) U.S. Cl.
CPC ............... *C23C 4/073* (2016.01); *C23C 4/134* (2016.01); *C23C 4/137* (2016.01); *C23C 14/022* (2013.01); *C23C 14/165* (2013.01); *C23C 24/04* (2013.01); *F23M 5/00* (2013.01); *F05D 2230/90* (2013.01); *F05D 2240/35* (2013.01); *F05D 2300/173* (2013.01); *F05D 2300/611* (2013.01); *F23M 2900/05001* (2013.01); *F23M 2900/05004* (2013.01)

(56) References Cited

U.S. PATENT DOCUMENTS

| | | | | |
|---|---|---|---|---|
| 6,083,322 | A * | 7/2000 | Burns | C23C 14/505 118/730 |
| 6,589,351 | B1 * | 7/2003 | Bruce | C23C 14/246 118/723 EB |
| 6,761,772 | B2 | 7/2004 | Giacri et al. | |
| 9,511,388 | B2 | 12/2016 | Tryon et al. | |
| 2004/0261914 | A1 * | 12/2004 | Boucard | C23C 28/345 148/518 |
| 2009/0324852 | A1 | 12/2009 | Schlichting et al. | |
| 2010/0189559 | A1 * | 7/2010 | Sharp | C23C 14/042 415/208.1 |
| 2012/0282402 | A1 * | 11/2012 | Neal | C23C 14/30 427/255.5 |

* cited by examiner

METALLIC COATING PROCESS FOR COMBUSTOR PANELS USING A BARREL CONFIGURATION

CROSS-REFERENCE TO RELATED APPLICATION(S)

This application claims the benefit of U.S. Provisional Application No. 62/613,723 filed Jan. 4, 20148 for "METALLIC COATING PROCESS FOR COMBUSTOR PANELS USING A BARREL CONFIGURATION" by F. J. Trzcinski, S. A. Elliott and A. Cervoni.

BACKGROUND

This disclosure relates to coating apparatuses and methods. More particularly, the disclosure relates to applying a protective overlay coating on combustor panels.

Combustor panels are susceptible to hot corrosion and oxidation. Many panels experience burn through before their service life is met leading to expensive replacement procedures. Metallic coatings are applied to increase the service life of the combustor panels by resisting the thermal degradation. Prior art coating procedures are time consuming and result in low throughput. Therefore, there is a need for metallic coating procedures for combustor panels with improved throughput.

SUMMARY

In one embodiment, a method of coating a component includes attaching the component to a support that is configured to hold a plurality of components attached lengthwise along the support and placing a base of the support in a holder that is attached to a rotatable member of a fixture, wherein an axis of the holder is parallel to an axis of rotation of the rotatable member. The method also includes transporting the fixture with the a component into a coating chamber wherein a direction of an exit stream of a coater is oriented perpendicularly to the axis of rotation of the rotatable member, exposing the fixture and the component to a reverse transfer arc (RTA) cleaning/pre-heating procedure while the rotatable member is rotating at a first rotational angular velocity for a first time period. The fixture and the component are then subjected to a coating procedure during which a coating is directed at the component in a direction perpendicular to the axis of the rotatable member while the rotatable member is rotating at a second angular velocity for a second time period. The method further includes transporting the fixture with the component to a cooling chamber and removing the component from the support fixture.

In another embodiment, a rotatable mounting fixture includes a rotatable plate oriented perpendicular to a rotation axis and at least one cylindrical tube attached to the periphery of the plate with a tube axis parallel to the rotation axis. The fixture also includes a removable linear mounting fixture inserted in the cylindrical tube, at least one mounting plate attached to the linear mounting fixture with an attachment feature for supporting a combustor liner; and a fixture attached to the rotatable plate opposite of the cylindrical tube configured for insertion into a rotating drive receptacle.

DETAILED DESCRIPTION

Generally, superalloy combustor panels may be coated with MCrAlY bondcoats wherein M may be Ni, Co, or Fe. The bondcoat may be applied by a low pressure plasma spray (LPPS) from a powder source. Other application methods including vapor phase plasma spraying (VPS), electron beam physical vapor deposition (EBPVD), cathodic arc, atmospheric pressure plasma spray (APPS), cold spray, and other candidates.

Figure 1:
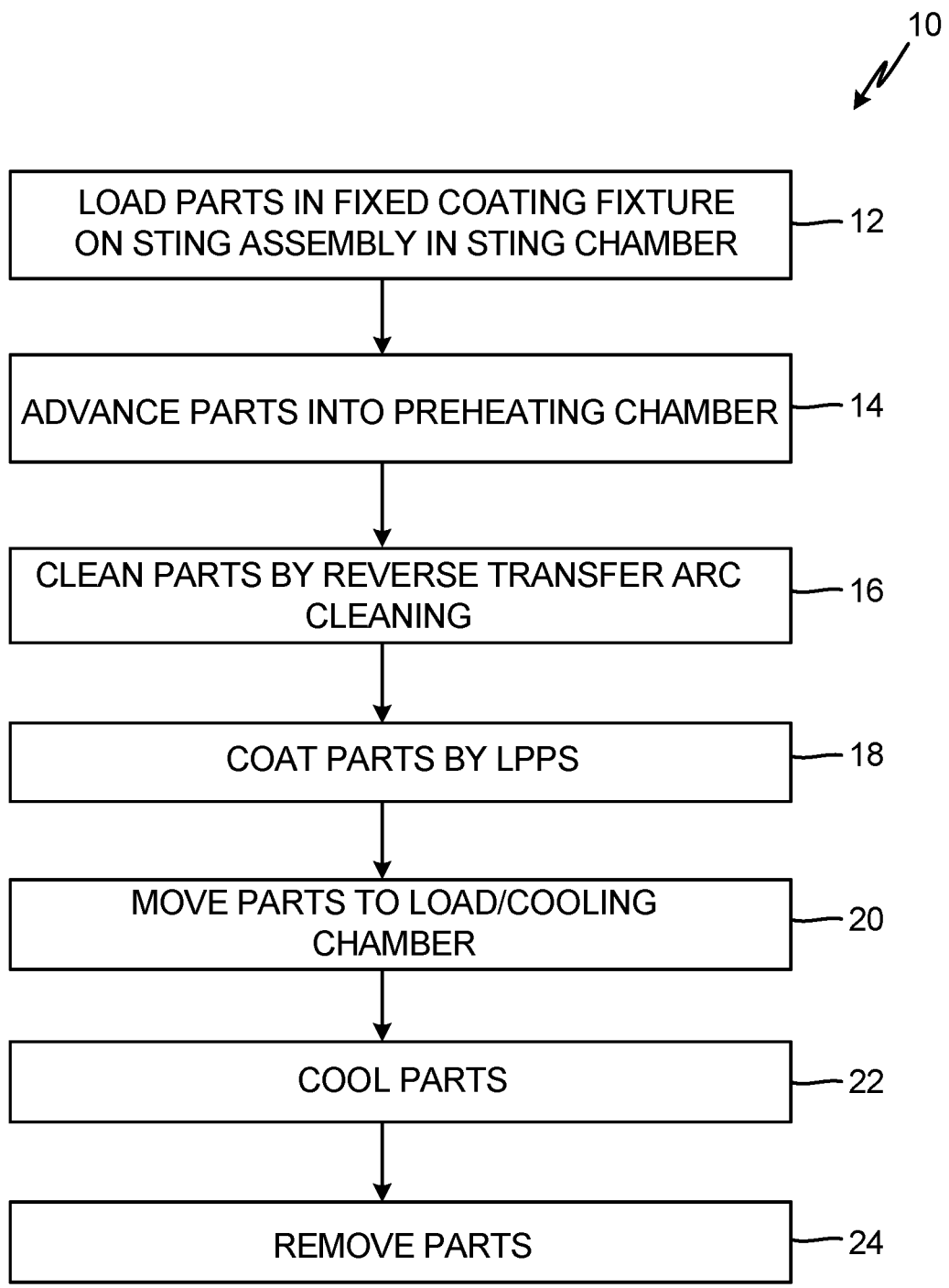
FIG. 1 illustrates a prior art coating process.

Prior art coating process 10 is shown in FIG. 1. Coating process 10 may be initiated by loading parts into a fixed carrier/fixture on a sting assembly in a sting chamber (not shown) (step 12). The sting assembly is a mechanical transport mechanism to transport parts into and out of a coater and to position the parts for preheating, cleaning, and coating operations while in the coater. Preheating may be carried out in one chamber and cleaning and coating may be carried out in separate chambers or in the same chamber.

If preheating is necessary, the parts may be positioned in a preheating chamber (step 14). Following preheating, the parts may be positioned in a cleaning chamber where the parts may be subjected to reverse transfer arc (RTA) cleaning that may also preheat the parts (step 16).

In the next step, the parts may be moved to a coating chamber in preparation for coating (step 18). The parts may then be coated with a bondcoat alloy (step 18). A preferred coating process is low pressure plasma spray (LPPS) coating, as mentioned above. Following coating, the parts may be moved to a load/cooling chamber (step 20) where they are cooled (step 22) and removed from the mounting fixture (step 24). The above prior art process is a time consuming low-yield process wherein only two to three parts may be treated during each coating run.

In contrast, the present disclosure provides an apparatus and method to improve throughput from two to three parts per coating run to twelve parts or more per run in a shorter time period. In the present disclosure, preheating step 14 of coating process 10 may be eliminated.

Figure 2:
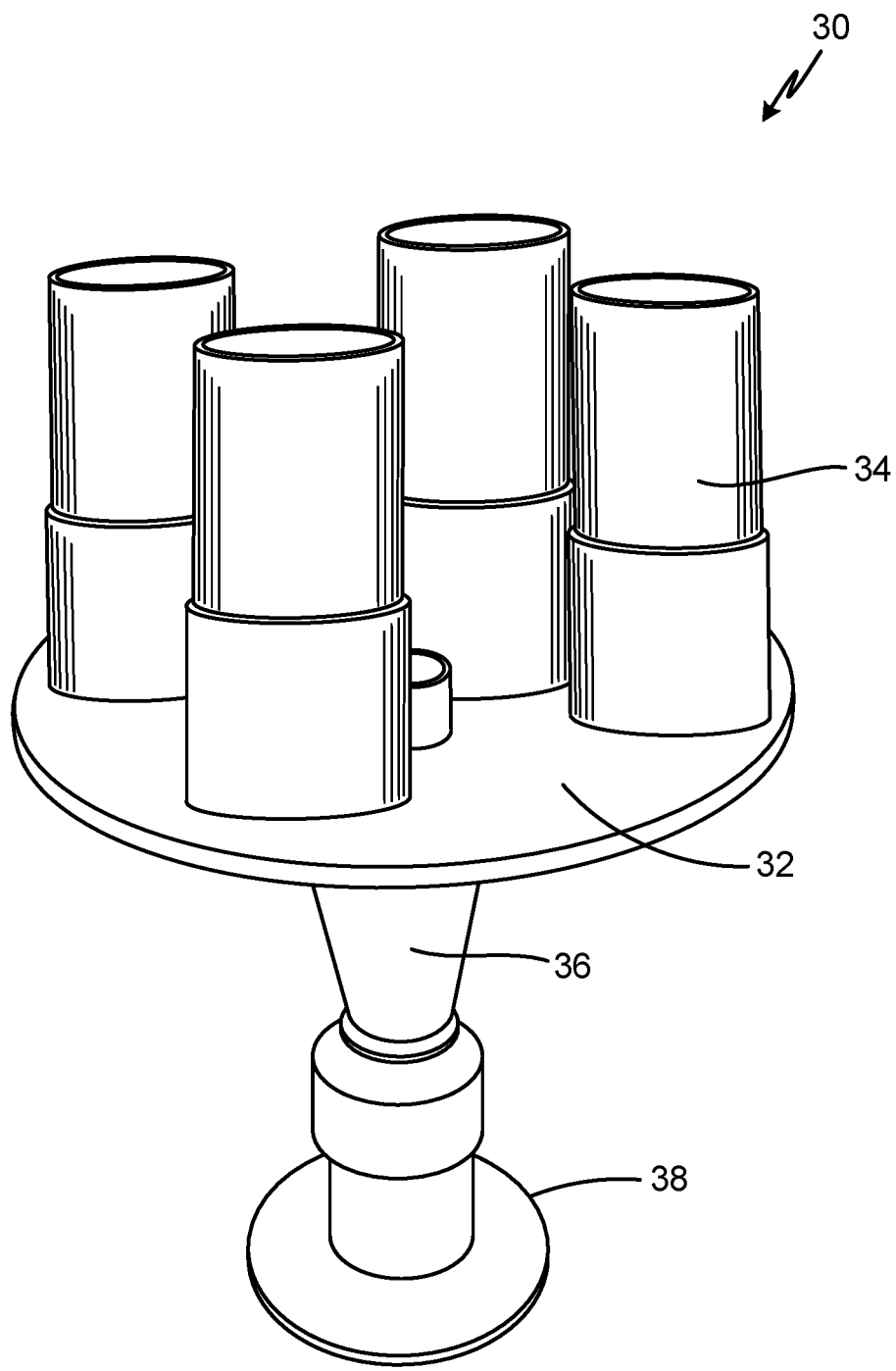
FIG. 2 is a perspective view of a mounting fixture base.

A perspective illustration of rotating support 30 of the present disclosure is shown in FIG. 2. Rotating support 30 comprises circular base 32, cylindrical tubular holders 34 extending circular base 32, and base attachment fixture 36 connected to circular base 32. Base attachment fixture 36 is configured to interface with holders on sting fixtures for transport in sting and coating chambers (not shown), for example, by being inserted into the holders. Base attachment fixture 36 may also be inserted in rotating support holder 38 for storage purposes. Rotating support 30 may be formed from a high temperature alloy examples of which may be high temperature nickel or iron base alloys.

In the illustrated embodiment, rotating support 30 has four tubular holders at the periphery of circular base 32. Depending on the application, rotating support 30 may be designed to contain greater or fewer tubular holders 34. Rotating support 30 may be designed to support parts for coating in a barrel configuration. Although in the present disclosure, rotating support 30 is configured to hold combustor panels, rotating support 30 may be adapted or adoptable to other part geometries and configurations.

Figure 3:
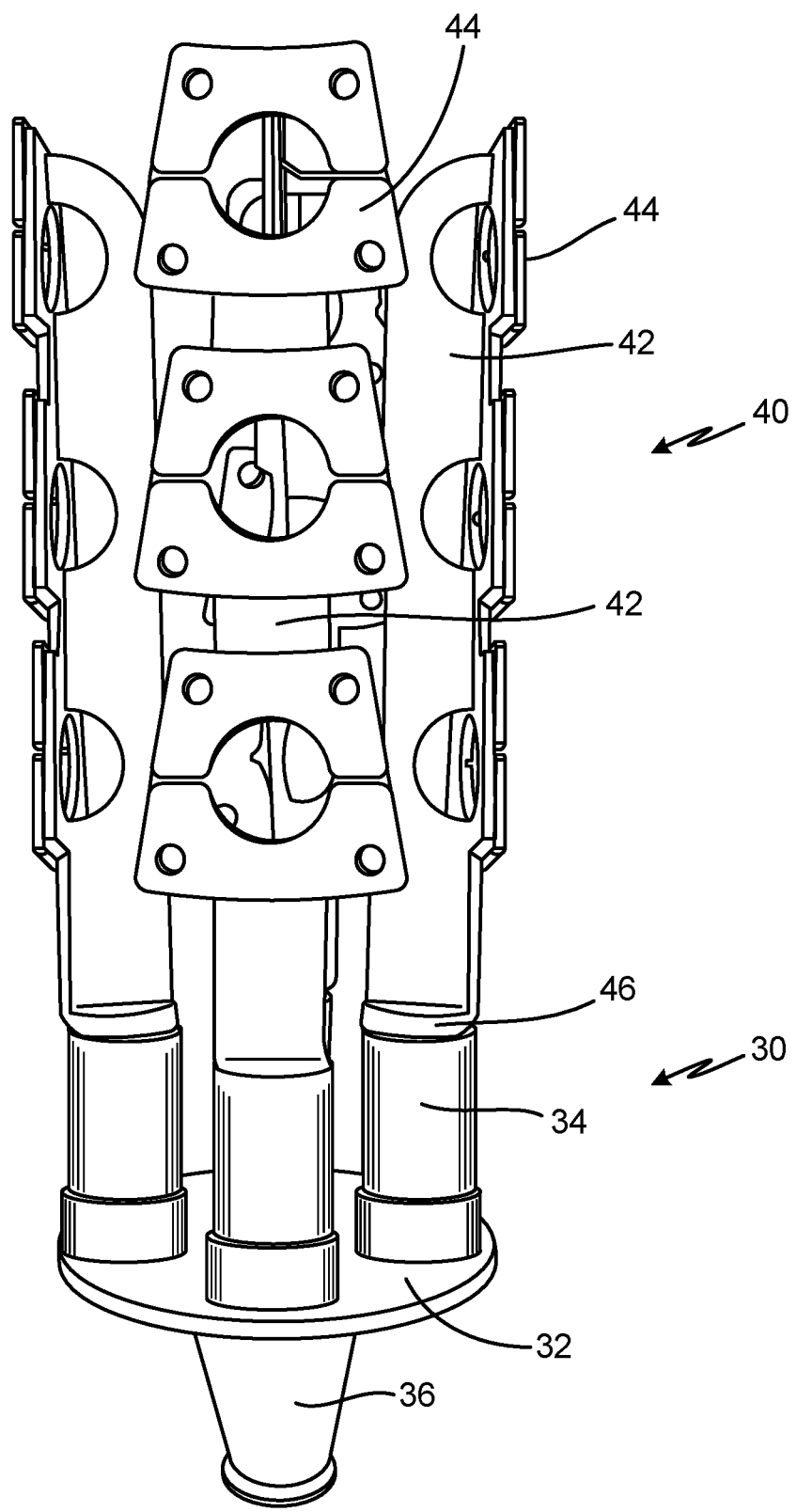
FIG. 3 is a perspective view of a mounting fixture.

A perspective illustration of rotating support 30 holding linear part supports 40 is shown in FIG. 3. In the present disclosure, parts (not shown) may be mounted in a linear fashion on linear supports 40 for insertion into tubular holders 34 on rotating support 30. Linear part supports 40 comprise linear T bars 42 with part mounting plates 44 attached along its length and base 46 attached at one end. Base 46 of linear part supports 40 may be inserted in holders 34 such that the rotational axis of circular plate 32 is parallel to the linear part supports 40. In the present invention, part mounting plates 44 contain holes for accommodating attachment features of combustor liners (not shown).

The components and configuration of rotating support 30 allow for parts, such as combustor liners, to be placed in a coating fixture (not shown) in a barrel configuration. During processing of the parts, the parts may be rotated while being exposed to the cleaning and coating operations. The barrel configuration eliminates excessive machine movement which improves processing time, and attachment fixture 36 allows for rotating support 30 to be attached to a sting transporter. Due to the rotation during coating, roughness of the coating is enhanced which results in increased adhesion of ceramic top coats subsequently applied to the MCrAlY bond coats on the part.

Figure 4:
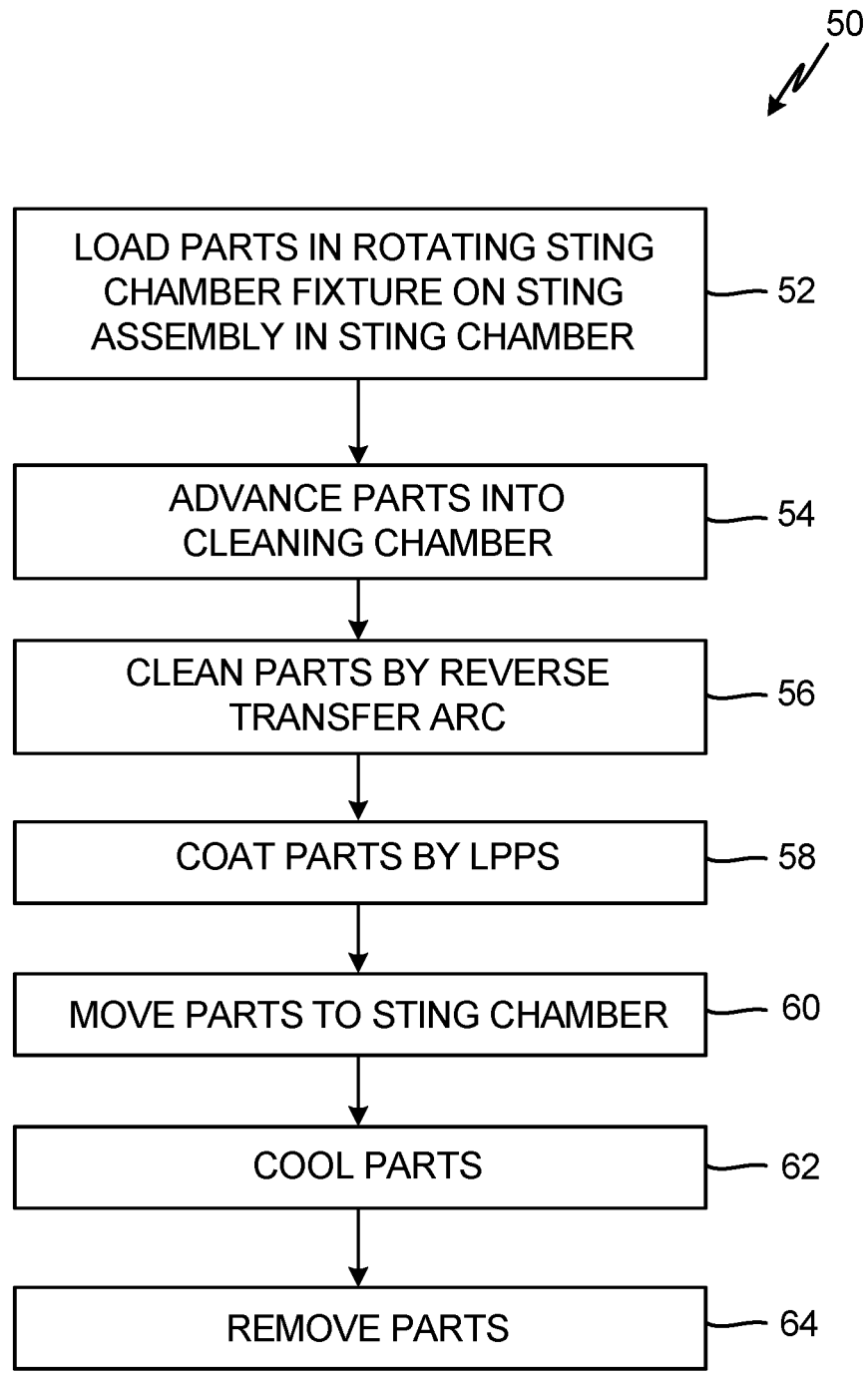
FIG. 4 illustrates a coating process of the present disclosure.

Method 50 of coating parts according to the present disclosure is shown in FIG. 4. Method 50 may be initiated by loading parts mounted on linear part supports 40 in circular base 30 in a rotating fixture of the invention on a sting assembly in a sting chamber (step 52). The rotating fixture of the invention may include rotating support 30 with linear part mounts 32 as shown in FIGS. 2 and 3. The parts (not shown) may be combustor liners or other components requiring high temperature metallic coatings. The parts may then be advanced into the cleaning chamber (step 54). The parts may be coated by LPPS in a plasma cleaning chamber.

The plasma cleaning chamber may be the deposition chamber since the deposition gun may also be used for reverse transfer arc (RTA) cleaning. The parts may be positioned such that the longitudinal axes of the linear part holders are perpendicular to the particle delivery stream of the coater. As the parts are advanced into the coating chamber, and plasma flame, the parts may be rotated by rotating support 30 at a slow rotation velocity. The deposition system in this step is set to clean the parts by RTA cleaning and the rotation velocity of the parts as the parts are advanced to the plasma controls the heating of the parts (step 56). The parts may be advanced into and withdrawn from the RTA flame multiple times during predetermined cycles for both cleaning and preheating the parts.

Once the parts have been cleaned and preheated, the coater may enter the coating phase (step 58). In the coating phase, the rotation velocity may be increased and rotating support 30 that holds the parts may advance and retreat from the plasma flame for a number of cycles until a proper coating thickness is achieved. Rotation of the parts during coating results in a roughened surface that aids the adhesion of a topcoat subsequently deposited on the bondcoat panels by APPS. Once the parts have been coated, the parts may be returned to the sting chamber (step 60) where they are cooled (step 62). Finally the parts are removed for further processing (step 64).

Transitioning from a stationary mounting fixture in a linear coating process as employed by the prior art to a rotational mounting fixture may result in a considerable improvement in production throughput. For example, a fourfold increase in coating throughput may be achieved in about the same processing time. Furthermore, machine downtime may be reduced due to less setup time and less operator touch time per part per run. In addition, consistency in coating coverage and surface roughness may be improved.

DISCUSSION OF POSSIBLE EMBODIMENTS

The following are non-exclusive descriptions of possible embodiments of the present invention.

A method of coating a component includes attaching the component to a support that is configured to hold a plurality of components attached lengthwise along the support and placing a base of the support in a holder that is attached to a rotatable member in a fixture in which the axis of the holder is parallel to an axis of rotation of the rotatable member. The method further includes transporting the fixture with the component into a coating chamber wherein a direction of an exit stream of a coater is oriented perpendicularly to the axis of rotation of the rotatable member and exposing the fixture and the component to a reverse transfer arc cleaning procedure while the rotatable member is rotating at a first rotational angular velocity for a first time period during which the component is heated to a first temperature. The method then includes exposing the fixture and the component to a coating procedure during which a coating is directed at the component in a direction perpendicular to the rotatable member while the rotatable member is rotating at a second angular velocity and is maintained at a second temperature for a second time period. And finally, transporting the fixture with the component to a cooling chamber and removing the component from the support fixture.

The method of the preceding paragraph can optionally include, additionally and/or alternatively, anyone or more of the following features, configurations, and/or additional components:

The component may be a combustor panel.

The coating may be low pressure plasma spray (LPPS), vacuum plasma spray (VPS), electron beam physical vapor deposition (EBPVD), cathodic arc, atmospheric pressure plasma spray (APPS), or cold spray The coating process may be LPPS.

The rotated member may be a circular plate.

The medal may be a bondcoat alloy.

The support may hold at least 6 components.

There may be at least four holders on the rotatable member.

A rotatable mounting fixture may include a rotatable plate orientated perpendicular to a rotation axis and at least one cylindrical tube attached to the periphery of the plate with a tube axis parallel to the rotation axis. The fixture may also include a removable linear mounting fixture inserted in the cylindrical tube and at least one mounting plate attached to the linear mounting fixture with an attachment feature for supporting a combustor liner and a fixture attached to the rotatable plate opposite of the at least one cylindrical tube configured for insertion into a rotating drive receptacle.

The fixture of the preceding paragraph can optionally include, additionally and/or alternatively, anyone or more of the following features, configurations, and/or additional components:

The rotatable plate, at least one cylindrical tube, the linear mounting fixture, and fixture for insertion into a rotating drive receptacle may be made of a high temperature metal alloy.

The alloys may be nickel or iron based alloys.

There may be four cylindrical tubes attached to the periphery of the rotatable plate which has a circular shape.

The linear mounting fixture may include six mounting plates.

A coating for a gas turbine component may include an aluminum containing bond coat alloy formed by thermal spray on a clean substrate surface wherein the surface has been cleaned by a reverse transfer arc cleaning process.

The coating of the preceding paragraph can optionally include, additionally and/alternatively, any one or more of the following features, configurations and/or additional components:

The gas turbine component may include a cluster panel.

The thermal spray may be low pressure plasma spray (LPPS).

The cleaning and coating processes may be performed simultaneously on at least twelve components mounted on a rotating fixture in a single multistep process.

The substrate may have been through a preheat process prior to coating.

The surface roughness during the coat cycle may increase APPS ceramic topcoat adhesion.

The bond coat alloy may be a MCrAlY alloy wherein M may be Fe, Mi, Co, or mixtures thereof, or PWA 264.

The invention claimed is:

1. A rotatable mounting fixture comprising:
a base attachment fixture having an axis that defines a rotation axis for the rotatable mounting fixture;
a rotatable plate attached to the base attachment fixture and oriented perpendicular to the rotation axis, wherein the rotatable plate has a circular shape with a circumference and is configured to rotate around the rotation axis;
a plurality of cylindrical tubes attached to a periphery of the rotatable plate opposite the base attachment fixture, wherein each of the plurality of cylindrical tubes has a tube axis parallel to the rotation axis and is configured to rotate with the rotable plate around the rotation axis;
a plurality of removable linear mounting supports wherein one of the plurality of removeable linear mounting supports is inserted into each of the plurality of cylindrical tubes, wherein each of the plurality of removable linear mounting supports is configured to rotate with rotable plate around the rotation axis and to hold a plurality of components attached lengthwise along each of the plurality of removeable linear mounting supports and each of the plurality of removable linear mounting supports further comprises a linear T bar with a mounting plate attached lengthwise along each of the plurality of removeable linear mounting supports, wherein the mounting plate is configured to accommodate attachment features of a combustor liner such that the combustor liner extends outside the circumference of the rotatable plate and to cause the combustor liner to rotate with rotable plate around the rotation axis.

2. The rotatable mounting fixture of claim 1 wherein the rotatable plate, the plurality of cylindrical tubes, the plurality of removeable linear mounting supports, and fixture for insertion into a rotating drive receptacle are comprised of a high temperature metal alloy.

3. The rotatable mounting fixture of claim 2 wherein the alloys are nickel or iron base alloys.

4. The rotatable mounting fixture of claim 1 wherein there are four cylindrical tubes attached to the periphery of the rotatable plate.

5. The rotatable mounting fixture of claim 1 wherein the linear mounting fixture include six mounting plates.

* * * * *